United States Patent [19]

Merrick

[11] Patent Number: 4,546,651
[45] Date of Patent: Oct. 15, 1985

[54] TRANSDUCER COUPLING

[75] Inventor: Edwin B. Merrick, Stow, Mass.

[73] Assignee: Hewlett-Packard Co., Palo Alto, Calif.

[21] Appl. No.: 595,756

[22] Filed: Apr. 2, 1984

[51] Int. Cl.$^4$ .............................................. G01L 9/12
[52] U.S. Cl. .......................................... 73/701; 331/65
[58] Field of Search ................. 73/701, 718, 724, 763, 73/765, 631; 177/210 C, 210 FP; 331/65

[56] References Cited

U.S. PATENT DOCUMENTS

| 4,434,664 | 3/1984 | Antonazzi | 73/701 |
| 4,449,409 | 5/1984 | Antonazzi | 73/724 |

Primary Examiner—Anthony V. Ciarlante
Attorney, Agent, or Firm—Donald N. Timbie

[57] ABSTRACT

A circuit for coupling a transducer having a reactive sensing element to equipment providing either AC or DC drive voltage and equipped with strain gauge amplifiers in which the sensing impedance varies the gain of the feedback loop of an oscillator, an AGC circuit is coupled to the loop so as to derive a control signal related to the amplitude of oscillations therein and a gain control means is included in the loop that responds to the control signal in such manner as to restore the loop gain to unity after it has been changed therefrom by changes in the value of the sensing impedance. If the gain control means is a voltage divider having a variable resistor as the operative element, a matched variable resistor is used as the unbalancing element of a resistive bridge, and the values of the circuit are chosen such that the output signal from the bridge which may be applied to strain gauge amplifiers is linearly or desirably nonlinearly related to changes in the value of the reactive sensing impedance. Operating potentials for the oscillator are derived by a rectifier from the drive voltage. If the control signals is to be used as a linear output signal, the variable resistor of the voltage divider is made to have a suitably nonlinear relation with respect to the value of the control signal. The variable resistor can be a nonlinear digitally controlled resistor in which event the control signal can be digitized without using an A/D converter.

15 Claims, 13 Drawing Figures

TRANSDUCER COUPLING

BACKGROUND OF THE INVENTION

Many equipments for indicating the value of a phenomenon such as pressure or displacement supply an AC or DC drive voltage and include a general purpose output amplifier. It is very simple to use a transducer circuit having a resistive sensing impedance with such equipment. All that is required is a resistive bridge including the resistive sensing impedance of the transducer in one arm thereof. The drive voltage supplied by the equipment, whether AC or DC, is applied across one diagonal of the bridge, and the input of the general purpose amplifier is coupled across the other diagonal. As the value of the resistance of the resistive sensing impedance is varied by pressure or other phenomenon of interest, the bridge is imbalanced so as to cause the amplitude of the voltage across the diagonal connected to the input of the general purpose amplifier to vary in like manner.

For various reasons, however, it is often desirable to use a transducer circuit having a reactive sensing impedance. A reactive sensing impedance requires an AC voltage and, for best operation, it is usually necessary that the frequency of the voltage lie within a narrow band. Transducer circuits have been suggested that have special active means for supplying the AC voltage and for deriving an analog signal proportional to the change in the value of the reactive sensing impedance. Unfortunately, however, the circuits cannot be directly connected to all of the equipments of the type described above because one equipment may supply an AC drive voltage and another may supply a DC drive voltage. Furthermore, the analog signal cannot be directly connected to the general purpose strain gauge amplifier. For these reasons, transducers of the prior art that used reactive sensing impedances are not compatible with equipment designed for use with transducer circuits having a resistive sensing impedance.

In such circuits, a digital signal representing the variations in the value of the reactive sensing impedance may be derived by applying the analog output signal to an A/D converter.

In some situations, it is desirable to provide a digitized signal representing variations in the value of a given phenomenon. Whereas this can be done by deriving an analog signal and applying it to an analog-to-digital converter, the converter adds considerably to the cost.

BRIEF SUMMARY OF THE INVENTION

Whether a transducer circuit incorporating this invention is to be compatible with equipment designed to work with a transducer circuit having a resistive sensing impedance or to provide a digitized output signal without using an A/D converter or to provide analog output directly, it will include amplifying means having its output coupled to its input so as to form an oscillating loop and thereby provide the AC voltage required by a reactive sensing impedance, a reactive sensing impedance coupled to said loop so that changes in its value will change the gain of the loop, an automatic gain control circuit coupled to said loop for providing a control signal having a value related to the amplitude of oscillations occurring in the loop, a gain control means for the loop coupled to receive the control signal in such manner as to maintain the gain of said loop at unity, and means responsive to the gain control signal for deriving a signal representing any variations in the value of said reactive sensing impedance that are brought about by variations in pressure or other phenomenon.

If the transducer circuit is to be compatible with equipment designed for use with a resistive sensing impedance (strain gauge amplifier), a rectifier is included in the circuit for deriving suitable operating potentials for its active elements from the drive voltage supplied by the equipment, whether it be AC or DC, and the means for providing the output signal includes a resistive bridge including a variable resistance means for imbalancing the bridge that has a value determined by the control signal provided by the automatic gain control circuit. The drive signal is applied across one diagonal of the bridge. For a given change in the value of the reactive sensing impedance caused by a change in the value of the pressure or other phenomenon applied to it, there will be a change in the gain of the loop that will change the amplitude of the oscillations occurring therein. This, in turn, will cause the automatic gain control circuit to change the value of the control signal applied to the gain control means so as to restore the loop gain to unity after a few oscillation cycles. The control signal is also applied so as to change the value of the variable resistance means in the bridge and cause a change in the voltage across its other diagonal that may be directly coupled to a strain gauge amplifier.

If the linearity of the output signal provided by the bridge is unimportant as, for example, when it is to be linearized by a microcomputer, the relationship between changes in the control signal provided by the automatic gain control circuit and changes in the gain of the loop brought about by applying the control signal to the gain control means can be different from the relationship between changes in the control signal and changes in the unbalance of the bridge brought about by applying the control signal to the variable resistance means included in the bridge; but if linearity is important, these relationships must be similar.

One way to make them similar and to thereby produce a linear output signal is to provide a gain control means for the loop in the form of a resistive voltage divider having a variable resistive element that is changed in value by the control signal so as to change the amount of voltage division and to include a preferably identical variable resistive means in the bridge that is changed in value by the control signal so as to change the balance of the bridge. Analysis will show that the output signal of the bridge will be linear if the ratio between the resistance of the divider viewed from the points where the variable resistive element is connected, but with the element removed from the circuit, to the resistance of the bridge viewed from the points where the variable resistive means is connected, but with the variable resistive means removed from the circuit, is the same for a control signal of interest as the ratio of the resistance of the variable resistive element of the divider to the resistance of the variable resistance means in the bridge.

It should be noted that the variable resistive element of the divider can be located above or below the intermediate point of the divider that is connected to the loop. Furthermore, a desired degree of nonlinearity such as might be required to compensate for a nonlinear relationship between changes in the phenomenon of interest and corresponding changes in the value of the reactive sensing impedance may be made by altering one of the ratios, e.g., making the resistances seen from the respective pairs of points different.

If the variable resistive element in the gain control means of the loop and the variable resistive means of the bridge are not adversely affected by the relationship between the voltage across them and the means for varying their resistances, as would be the case if their resistances were controlled by light having an intensity determined by the control signal from the automatic gain control circuit, the variable resistive element can be one of the elements of a resistive voltage divider and the variable resistive means can be inserted in one arm of the bridge. If there is a possible adverse relationship, however, they must be connected into their respective circuits in a special way.

In the preferred embodiment, a dual FET is respectively used as the variable resistive element of a voltage divider that is the gain control means for the loop and the variable resistive means for the bridge. Proper operation of the FET as variable resistors requires that the relationship between a control voltage applied to the gate electrode and the voltage at the center of its channel be unaffected by any voltage applied between the source and drain electrodes. This can be attained for the FET used as the variable resistance element of the voltage divider used as the gain control means for the loop by connecting its gate electrode to the mid-point of a high impedance voltage divider connected in shunt with the FET. Attaining this result for the FET used as the variable resistive means for the bridge requires that the FET be connected between points of the bridge that are symmetrically located with respect to and on opposite sides of the reference potential. Although this makes analysis more difficult than for a simple bridge, linearity is affected in the same way by the ratios previously referred to.

The ratios referred to that must exist in order to attain linearity or a desired degree of nonlinearity between variations in the output signal of the bridge and variations in the value of the reactive sensing impedance can be attained by a nearly infinite number of combinations of the values of the various resistances. There are, however, a number of design objectives that should be attained such as an output impedance of the bridge that works best with equipment providing the drive voltage and containing the amplifiers, a useable sensitivity and a low load on an amplifier in the loop, and they must be attained with satisfactory variable resistance elements and means. A suitable compromise can be made between these objectives by use of an iterative process that starts with assumption of the values of certain resistors.

Whereas it is easier to provide a linear output signal from the bridge by using a gain control means for the loop having a variable resistive element therein and using an identical means for the variable resistance means of the bridge, it is not necessary for them to be the same. A controlled gain amplifier could be used in place of the variable resistive element in the loop gain control means and a variable resistive means could still be used in the bridge and a linear output signal could be attained as long as their respective response to the control signal from the automatic gain control circuit were similar.

In order to make the control signal provided by the automatic gain control circuit vary linearly with the changes in value of the reactive sensing impedance, the relationship between the control signal and the variable element it controls in the loop gain control means must compensate for any nonlinearity that exists between changes in the value of the control element necessary to obtain unity gain and the changes in the value of the sensing impedance. Such nonlinearity in the relationship between the control voltage and the value of the variable control element can be attained by using a suitable nonlinear digitally controlled resistance in a voltage divider driven by a counter and a decoder. The digital output of the counter will be linearly related to the changes in the value of the sensing impedance.

Although an oscillator having a single amplifying device can be employed, it has been found advantageous in accordance with another aspect of the invention to use an amplifying device having a gain $G_1$ greater than unity, an inverting amplifier having a gain of $-1$, and an attenuator having a gain of $+G_A$ such that $(-G_1) \times (-1) \times (+G_A)$ equals unity.

Another different aspect of the invention is the manner in which it can be used to provide a digitized output signal corresponding to the variations in the phenomena used to vary the value of the reactive sensing impedance at low cost. The variable resistance used in the attenuator to control the gain of the oscillator loop in response to the control signal is of the digital type and is provided with a nonlinear relation to the control signal that is the inverse of the nonlinear relation, to be described, between variations in the value of the sensing impedance and variations in the value of the digital resistance that must occur in order to restore unity gain. Under a condition of unity gain, the value of the digital resistance will be the same regardless of the kind of variable resistance used; but the control signal, and therefore its digitized form, that is used to control the digital resistance will vary linearly with the variations in the value of the sensing impedance and with variations in the phenomenon of interest. As can be seen, the means for deriving the digitized output signal is an integral part of the circuit rather than a mere addition.

When the control signal is applied to a variable resistance that is not provided with the nonlinearity of the digital resistance just described, the control signal does not conform to the variations in the value of the sensing impedance and cannot be used directly as a linear output signal. In such event, as previously described, the control signal is supplied to control a variable resistance of a bridge circuit that is identical or proportional to the variable resistance used to control the gain of the oscillatory loop, and the nonlinearity between the value of the variable resistance in the bridge and the output signal provided by the bridge is such as to compensate for the nonlinearity between the value of the variable impedance and the value of the sensing impedance under the condition when the loop gain is unity.

The use of the gain control loop permits the derivation of many different types of output signals.

DETAILED DESCRIPTION OF THE INVENTION

Figure 1:
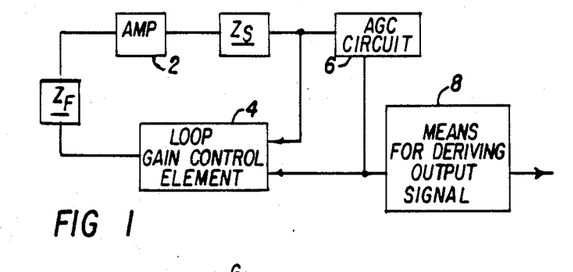
FIG. 1 is a block diagram of a circuit of this invention.

In FIG. 1, an oscillatory loop is shown as being comprised of an amplifier 2, an impedance $Z_F$ that is coupled to the loop so as to determine the frequency at which it oscillates, a gain control element 4 and a sensing impedance $Z_S$ that is coupled so as to change the gain of the loop as its value is made to vary by a phenomenon of interest, such as displacement or pressure. An automatic gain control circuit 6 is coupled so as to receive oscillations occurring in the loop and provide a gain control signal to the loop gain control element 4 so as to cause it to return the gain of the loop to unity after it has been displaced therefrom by a change in the value of $Z_S$. The gain control signal is also applied to a means 8 for producing an output signal that corresponds to variations in the value of the phenomenon that controls the value of $Z_S$. The particular sequence in which these components appear in the loop is unimportant.

The operation of FIG. 1 is as follows. At turn-on, $Z_S$ is at its quiescent value and the AGC circuit 6, seeing no output from the amplifier 2, adjusts the loop gain control element 4 toward maximum gain. Under this condition, the gain around the loop exceeds unity and oscillations commence at a frequency determined by $Z_F$. When the oscillations reach an amplitude in excess of the threshold of the AGC circuit 6, it adjusts the loop gain control element 4 so as to establish the loop gain at unity and cause the oscillations to have a constant amplitude. Thereafter, any change in $Z_S$ from its quiescent value brought about by changes in the phenomenon of interest momentarily increases or decreases the gain in the loop so as to cause the amplitude of the oscillations to increase or decrease. Within a few cycles, the AGC circuit 6 causes the gain control element 4 to bring the amplitude of the loop oscillations nearly back to their original amplitude. If the characteristics of the means 8 for deriving the output are suitably chosen, the output signal will be linear with respect to changes in the value of the phenomena.

If, however, for reasons previously set forth, the loop gain element 4 has the appropriate nonlinearity, it becomes the means for deriving the output signal because the AGC control signal becomes a linear output signal and the means 8 can be dispensed with.

Figure 2:
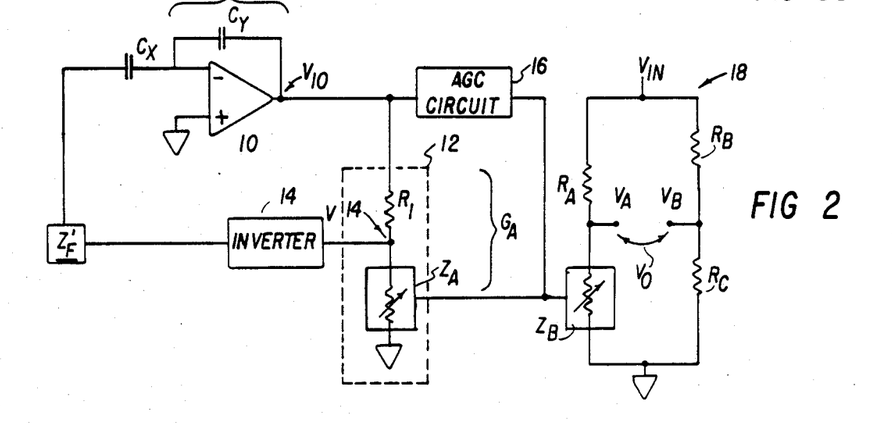
FIG. 2 is a block diagram of a circuit of this invention having a little more detail than FIG. 1.

Reference is now made to FIG. 2 for a mathematical demonstration of the fact that a circuit of this invention can control a resistive bridge so as to produce an output signal that is linearly related to changes in phenomenon that are detected by a reactive sensing impedance. The amplifier for the loop is herein shown as being a high gain operational amplifier 10 which should have minimal change in gain or bandwidth in the presence of variations in supply voltage or temperature. $C_X$ and $C_Y$ are capacitive reactive impedances used in the feedback circuit of the amplifier to control its gain. Either $C_X$ and $C_Y$ is made to change value either proportionally or in inverse proportion to a phenomenon of interest, such as pressure. In any case, $C_X$ and $C_Y$ should be incorporated in the circuit such that the closed loop gain of the amplifier 10 is proportional to $$1/(K_0 - K_1 P) \tag{1}$$

where $K_0$ and $K_1$ are constants and P is the applied pressure or other phenomena of interest.

The amplifier 10 is included in a loop having an attenuator 12, an inverter 14 and an impedance $Z_F$ for determining the frequency at which the loop operates. If the inverter 14 is a one-to-one tuned transformer, it will include the impedance $Z_{F'}$. The attenuator 12 is comprised of a resistor $R_1$ connected in series with a controllable resistor $Z_A$ between the output of the amplifier 10 and ground, and the input of the inverter 14 is connected to the junction of $R_1$ and $Z_A$. An AGC circuit 16 is connected to the output of the amplifier 10 and derives a control signal having an amplitude corresponding to the deviation from a normal value in the amplitude of the oscillations as controlled by the AGC circuit at the output of the amplifier 10. In this circuit, the means for deriving the output signal from the AGC control signal is a resistive bridge 18 that is comprised of a resistor $R_A$ and a controllable resistor $Z_B$ connected in series between a voltage $V_{IN}$ and ground and a parallel series circuit of resistors $R_B$ and $R_C$. The impedance element $Z_B$ is in most cases an element which is matched to $Z_A$; but, as will be shown, they can be made to have different values so as to modify the linearity of the system and correct for the nonlinear relation of the sensing impedance, $C_X$ or $C_Y$, to the phenomena of interest.

The general operation of the circuit of FIG. 2 is the same as that already explained in connected with FIG. 1 and may be more particularly analyzed as follows. Assume that $C_Y$ is fixed and that it tracks $C_X$ with variations in temperature as explained in U.S. Pat. No. 4,185,641 to Tykulsky. In general $$C_X = (AK_3)/d \tag{2}$$

wherein A is the area of the capacitor, $K_3$ is a constant and d is the spacing between the plates of the capacitor. The relationship between the spacing d and the pressure or other phenomena P applied to the capacitor may be defined by $$d = K_4 - K_5 P \tag{3}$$

wherein $K_4$ and $K_5$ are constants. By substitution, we obtain $$C_X = AK_3 \frac{1}{K_4 - K_5 P} \tag{4}$$

and thus $$Z_X = \frac{1}{j\omega C_X} = \frac{K_4 - K_5 P}{j\omega A K_3} \qquad (5)$$

As is well known, the closed loop gain $G_1$ of the operational amplifier 10 is very nearly $$G_1 = Z_Y/Z_X = \frac{1/(j\omega C_Y)}{(K_4 - K_5 P)/j\omega A K_3} \qquad (6)$$

and inasmuch as $C_Y$ is fixed, we obtain $$G_1 = 1/(K - K_1 P) \qquad (7)$$

A similar relationship may be derived for inductive reactance if the sensing element should be inductive.

The input/output voltage ratio $V_{14}/V_{10}$ of the attenuator 12 is $G_A$ and is given by $$\frac{V_{14}}{V_{10}} = G_A = \frac{Z_A}{R_1 + Z_A} = \frac{1}{(R_1/Z_A) + 1} \qquad (8)$$

In the case where the inverter gain in chosen as unity to sustain constant amplitude oscillation, it must be that $$G_1 \times G_A = 1 \text{ or } G_1 = 1/G_A. \qquad (9)$$

By substitution from (7) and (8), we obtain $$\frac{1}{K - K_1 P} = (R_1/Z_A) + 1 \qquad (10)$$

When (10) is solved for $Z_A$ as a function of pressure or other phenomena, we obtain $$Z_A = \frac{R_1}{1/[(K - K_1 P) - 1]} \qquad (11)$$

Now consider the bridge circuit 18 of FIG. 2. By simple proportion, the voltage $V_A$ at the junction of $R_A$ and $Z_B$ is $$V_A = V_{IN}\left(\frac{Z_B}{R_A + Z_B}\right), \qquad (12)$$

the voltage $V_B$ at the junction of $R_B$ and $R_C$ is $$V_B = V_{IN}\left(\frac{R_C}{R_B + R_C}\right) \qquad (13)$$

and the output voltage $V_O$ is $$V_O = V_A - V_B = V_{IN}\left(\frac{Z_B}{R_A + Z_B}\right) - V_{IN}\left(\frac{R_C}{R_B + R_C}\right) \qquad (14)$$

and $$\frac{V_O}{V_{IN}} = \left(\frac{Z_B}{R_A + Z_B}\right)\left(\frac{R_C}{R_B + R_C}\right). \qquad (15)$$

Solving (15) for $Z_B$, we obtain $$Z_B = \frac{R_A}{\left[\frac{1}{\left(\frac{V_O}{V_{IN}}\right) + \left(\frac{R_C}{R_B + R_C}\right)}\right] - 1}. \qquad (16)$$

By appropriate selection of elements, we can force $Z_A = Z_B$ so that their respective definitions in (11) and (12) can be equated and obtain $$\frac{R_1}{\left(\frac{1}{K - K_1 P}\right) - 1} = \qquad (17)$$

$$\frac{R_A}{\left[\frac{1}{\left(\frac{V_O}{V_{IN}}\right) + \left(\frac{R_C}{R_B + R_C}\right)}\right] - 1}.$$

By making $R_1 = R_A$ and solving for $V_O/V_{IN}$, we obtain $$\frac{V_O}{V_{IN}} = (-K_1 P + K) - \left(\frac{R_C}{R_B + R_C}\right). \qquad (18)$$

By inspection of equations (6) and (7), it can be seen that $$K = (C_Y K_4)/A K_3 \qquad (19)$$

so that we can force $$K = R_C/(R_B + R_C) \qquad (20)$$

and therefore obtain $$V_O/V_{IN} = -K_1 P. \qquad (21)$$

Thus, it has been shown that although $Z_A$ may not itself be a linear function of pressure or other phenomena, and although $Z_B$ may not be linearly related to $V_O/V_{IN}$, $V_O/V_{IN}$ can be made proportional to pressure or other phenomena by proper choice of component values. It is also clear that the performance of the circuit does not depend on the voltage controlled characteristics of $Z_A$ and $Z_B$ if they are very similar, preferably identical, and the AGC circuit 16 has sufficient gain.

On the other hand, if the voltage controlled characteristic of $Z_A$ is complementary to the nonlinearity between $Z_A$ and the pressure or other phenomena P as expressed in the equation (11), the control signal provided by the ACG circuit 16 will vary as the pressure or other phenomenon used to vary $C_X$ and can be used directly. If $Z_A$ is a digitally controlled resistance having the nonlinearity referred to, the analog AGC signal is converted to its digital form and represents the pressure variations. Such an output signal may be desired in some situations, but is not important when a bridge is used to provide the output signal.

Figure 3:
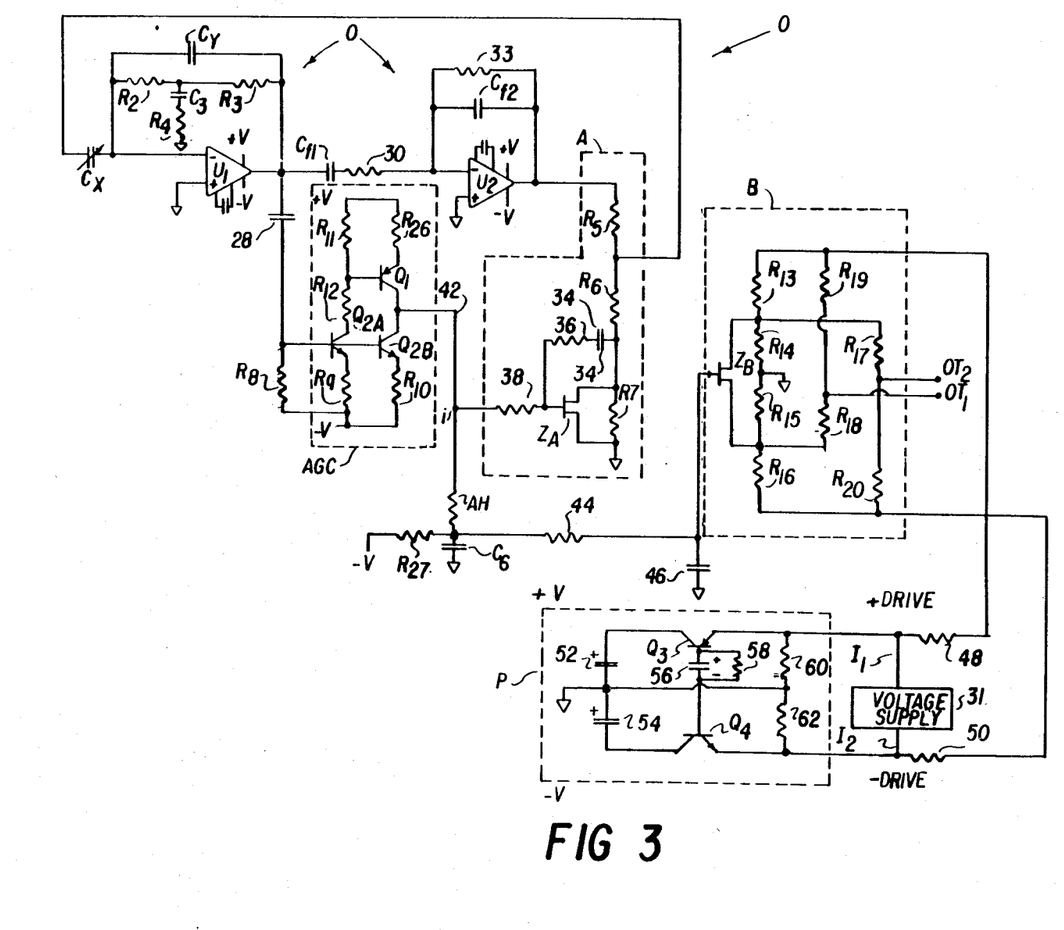
FIG. 3 is a schematic diagram of a preferred form of circuit incorporating the invention.

Reference is now made to the schematic diagram of FIG. 3 for a description of an embodiment of the invention in which the variable resistances $Z_A$ and $Z_B$ are FETs.

FIG. 3 in General

In general, the circuit is comprised of an oscillator O having two operational amplifiers $U_1$ and $U_2$, a phenomenon sensing impedance $C_X$ coupled to $U_1$ so as to vary its gain, capacitors $C_{f1}$, $C_{f2}$, $R_{30}$ and $R_{33}$ coupled to $U_2$ so as to determine the frequency of the oscillator, and a controllable attenuator A in which a FET $Z_A$ is the variable element, connected in a loop. An AGC circuit is coupled via a capacitor 28 to the output of $U_1$ and derives a control signal current having an amplitude corresponding to the amplitude of the error in oscillations at the output of $U_1$. The control signal is coupled to AH, $C_6$ and the gate of the FET $Z_A$ so as to control its resistance in such manner as to tend to restore the gain of the loop to unity whenever the gain is made to depart from unity by a change in the value of $C_X$ resulting from a change in pressure or other phenomenon of interest. The control signal from the AGC circuit is also coupled so as to control the resistance of a FET $Z_B$ which controls the balance of a bridge B and produces an output signal $V_{OUT}$ between its output terminals $OT_1$ and $OT_2$. The output signal corresponds to the value of the sensing capacitor $1/C_X$, which in turn corresponds inversely to pressure or some other phenomenon of interest. Voltage from a source 31 contained within the equipment with which the circuit is to be used is applied to input terminals $I_1$ and $I_2$, and a power supply P is connected between these terminals so as to produce operating voltages $+V$ and $-V$ for the amplifiers $U_1$ and $U_2$.

FIG. 3 in Detail

In particular, the details of the oscillator circuit O are as follows. A DC operating point for $U_1$ is established by connecting resistors $R_2$ and $R_3$ in series between its inverting input and its output and by connecting a capacitor $C_3$ and a resistor $R_4$ in series between the junction of the resistors $R_2$ and $R_3$ and ground. The sensing capacitor $C_X$ is connected in series with a reference capacitor $C_Y$ (see U.S. Pat. No. 4,185,641 to Tykulsky), their junction is connected to the inverting input of $U_1$, and $C_Y$ is connected between that input of $U_1$ and its output. The capacitor $C_{f1}$ and a resistor 30 are connected in series between the output of $U_1$ and the inverting input of $U_2$, the parallel combination of the capacitor $C_{f2}$ and a resistor 32 is connected between the inverting input of $U_2$ and its output, and the non-inverting input of $U_2$ is connected to ground. Completion of the oscillatory loop is to the side of $C_X$ that is remote from $C_Y$ via the attenuator A now to be described.

The attenuator A is comprised of a resistor $R_5$ connected in series with a resistor $R_6$ and a parallel combination of the FET $Z_A$ and a resistor $R_7$. A capacitor 34 and a resistor 36 are connected in series between the junction of $Z_A$ and $R_6$ and the gate of $Z_A$, and a resistor 38 is connected between the control input i of the attenuator A and the gate of $Z_A$. The resistance of the resistor 36 is made equal to the sum of the resistance of the resistor 38 and a resistor AH so as to apply one-half of the oscillatory voltage across $Z_A$ to its gate and thus keep it at the same potential with respect to the center of the channel of the FET $Z_A$ as far as the oscillatory voltage is concerned. The impedance of a capacitor $C_6$ is low at the frequency of oscillations in the loop relative to the resistors 36 and 38. The capacitor 34 prevents voltage division of DC.

The AGC Circuit

Although any automatic gain control circuit could be used, the particular one shown has the advantages of low power consumption, high gain, the ability to make an amplitude correction either up or down in a few cycles of the oscillator O, and the ability to use $V_{BE}$ voltages as a threshold reference or an outside voltage as a reference in such manner as to permit temperature compensation. A resistor $R_8$ is connected between the capacitor 28 and $-V$ so as to form a coupling network to the oscillator O that applies oscillatory waveforms to the bases of dual transistors $Q_{2A}$ and $Q_{2B}$. Resistors $R_9$ and $R_{10}$ are respectively connected between the emitters of $Q_{2A}$ and $Q_{2B}$ and $-V$ so that their collector currents will be proportional to base voltage above $V_{BE}$, which is approximately 0.6 volt. The collector of $Q_{2A}$ is connected to $+V$ via series resistors $R_{11}$ and $R_{12}$ and their junction is connected to the base of a transistor $Q_1$ having its collector connected to the collector of $Q_{2B}$ and its emitter connected by a resistor $R_{26}$ to $+V$. Note that $Q_{2A}$, $Q_{2B}$ and $Q_1$ are such that current can flow through them from $+V$ to $-V$. The control current corresponding to the error in amplitude of the oscillations is delivered to a capacitor $C_6$. One side of $C_6$ is connected to ground and the other side is connected via an anti-hunt resistor AH and a lead 42 to the collectors of $Q_1$ and $Q_{2B}$. Resistor $R_{27}$ is connected between $-V$ and the ungrounded side of $C_6$ for startup purposes. The control signal at the collectors of $Q_1$ and $Q_{2B}$ is applied to the input i of the attenuator A so as to control the resistance of the FET $Z_A$ in such manner as to tend to restore the gain of the oscillatory loop O to unity.

Operation of the AGC circuit is as follows. As $Q_{2B}$ turns on, it draws current from capacitor $C_6$ through resistor AH. Initially, $Q_{2A}$'s current only causes a voltage drop in $R_{11}$ and $R_{12}$. However, as $Q_{2A}$'s collector current increases to about 30 $\mu$A, $Q_1$ begins to turn on. Now, if $Q_1$ has a beta of 200 or more, $Q_1$'s collector current will be approximately 18 to 20 times the incremental increas in $Q_{2A}$'s collector current above 30 $\mu$A. Therefore $Q_1$'s collector can quickly exceed $Q_{2B}$'s collector current.

There is therefore a peak input amplitude which will cause $Q_{2B}$'s and $Q_1$'s integrated collector currents to be equal so as to cancel each other which for the resistor values shown is approximately 1 volt. Greater peak amplitude than this will cause $Q_1$'s collector current to dominate, causing the voltage on $C_6$ to rise incrementally for each oscillator cycle. Lesser peak amplitude will cause $Q_{2B}$'s collector current to dominate, thus causing $C_6$'s voltage to fall incrementally with each succeeding oscillator cycle. At a given input frequency, this operation might be described as a proportional charge pump; that is, for a given amplitude error, an increment of charge will be transferred to or from $C_6$ for each cycle of the input frequency. A larger error will cause a proportionally larger charge increment to be transferred to or from $C_6$.

Figure 3A:
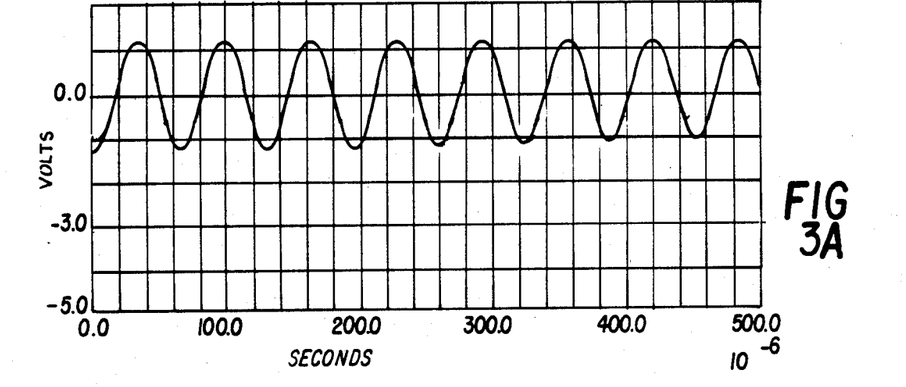
FIG. 3A represents the output voltage of the oscillator.
Figure 3B:
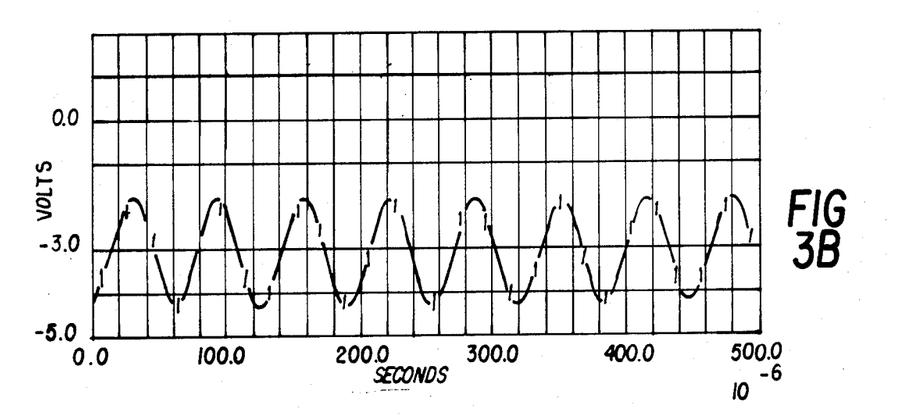
FIG. 3B represents the voltage applied to the bases of dual transistor $Q_2$.
Figure 3C:
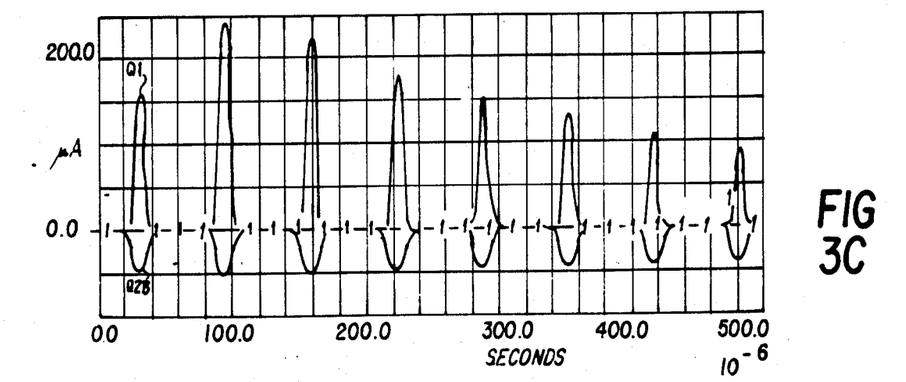
FIG. 3C illustrates the collector currents of $Q_{2B}$ and $Q_1$.
Figure 3D:
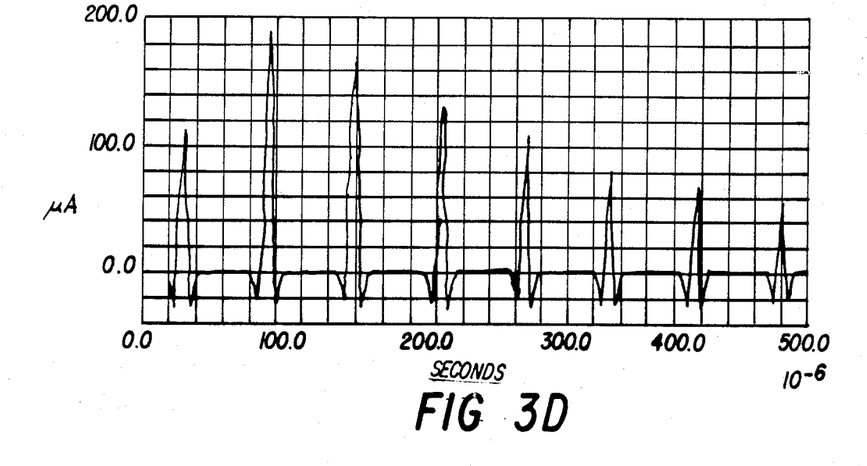
FIG. 3D illustrates the sum of the collector currents of $Q_{2B}$ and $Q_1$.
Figure 3E:
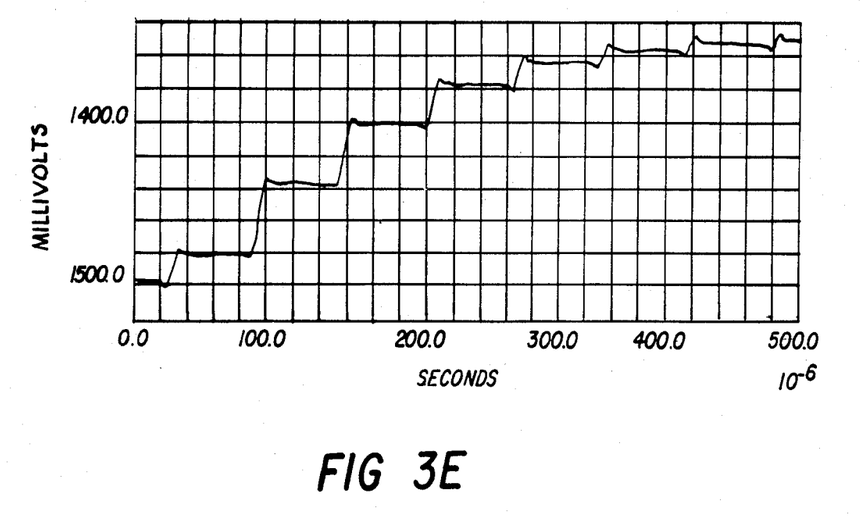
FIG. 3E illustrates the control voltage on the capacitor 6 during a period of amplitude correction of the oscillator.

The waveforms of FIGS. 3A through 3E will be helpful to further visualize the operation of the AGC circuit. The waveform of FIG. 3A shows the oscillator waveform which is the input to the AGC circuit. It happens to be centered on 0 volts and of a little over a volt peak amplitude. At time equals zero, a change was introduced to cause the oscillator to increase its amplitude although these effects are just barely visible on this scale. The positive peaks of FIG. 3C show the current in $Q_1$ and the negative peaks show the current in $Q_{2B}$. FIG. 3D shows the combined collector current of $Q_{2B}$ and $Q_1$ on the same plot. These two currents flow to AH and $C_6$. The purpose of $C_6$ is to integrate the currents flowing to and from $Q_{2B}$ and $Q_1$ and to store a resultant voltage during the portion of the oscillatory waveform when $Q_{2B}$ and $Q_1$ are non-conducting. The purpose of resistor AH is to stabilize the amplitude control loop. Its effect is to allow the loop to anticipate amplitude changes and thus reduce large overshoot transients or in the extreme amplitude control loop oscillations. FIG. 3E shows the resultant establishment of a new control signal voltage stored on capacitor $C_6$.

Bridge Circuit

The control signal voltage of FIG. 3E that appears across $C_6$ is coupled via a low pass filter comprised of a resistor 44 and a capacitor 46 to the gate of a FET $Z_B$ which, as previously noted, is the imbalancing element of the bridge B. Resistors 48, $R_{13}$ and $R_{14}$ are connected in the order named between one side of the voltage supply 31 and a point of reference potential, and resistors 50, $R_{16}$ and $R_{15}$ are connected in the order named between the other side of the supply 31 and the point of reference potential. One end of a resistor $R_{19}$ is connected to the junction of the resistors 48 and $R_{13}$; and its other end is connected via a resistor $R_{18}$ to the junction of the resistors $R_{15}$ and $R_{16}$. One end of a resistor $R_{20}$ is connected to the junction of the resistors 50 and $R_{16}$, and its other end is connected via a resistor $R_{17}$ to the junction of the resistors $R_{13}$ and $R_{14}$. The junction $OT_1$ of the resistors $R_{19}$ and $R_{18}$ is one output terminal of the bridge B and the junction $OT_2$ of the resistors $R_{20}$ and $R_{17}$ is the other output terminal of the bridge B. The reference potential is centered with respect to the voltage supply 31, and the values of the various resistors are such that the output terminals $OT_1$ and $OT_2$ are at reference potential when the bridge is in balance.

The reason for using a bridge circuit like B that is more complicated than the bridge circuit of FIG. 2 is to ensure that the relationship between the voltage of the gate of $Z_B$ and the central point of its channel is not affected by the bridge driving voltage provided by the supply 31.

In a manner to be explained, variations in the value of the control signal from the AGC circit that are necessary to restore the gain of the oscillatory loop to zero cause variations in the resistance of $Z_B$ that produce an output signal between the output terminals $OT_1$ and $OT_2$ corresponding to changes in the value of $1/C_X$. Nonlinearity can be purposefully introduced in this outputsignal so as to compensate for nonlinearity between the value of $1/C_X$ and the phenomena of interest by selecting suitable values for $R_5$ and $R_6$, as has been explained.

The following table of values of the various circuit components of FIG. 3 which have been found to work well is set forth below, but different values could be used without departing from the invention.

TABLE

| | | |
|---|---|---|
| $C_Y$ = 70 pf | $R_5$ = 1700 | $R_{11}$ = 20K |
| $C_X$ = 150 pf to 145 pf | $R_6$ = 1300 | $R_{12}$ = 20K |
| $C_{34}$ = .047 μf | $R_{14}$ = 3585 | $R_{20}$ = 3585 |
| $C_{f1}$ = .001 μf | $R_{18}$ = 26.1 | $R_{14}$ = 261 |
| $C_{f2}$ = 470 pf | $R_{10}$ = 10K | $R_{15}$ = 261 |
| $C_{28}$ = .047 μf | $R_{21}$ = 50-1500 | $R_{13}$ = 3160 |
| $C_6$ = .1 μf | $R_{22}$ = 50-1500 | $R_{35}$ = 23K |

TABLE-continued

| | | |
|---|---|---|
| $C_{46}$ = .047 μf | $R_{30}$ = 400K | $R_{32}$ = 400K |
| $Q_{2B}$ = 2N2977 | $R_{36}$ = 1K | $R_{33}$ = 37.9K |
| $Q_{2A}$ = 2N2977 | $R_d$ = 522 | $R_{27}$ = 10 M |
| $Q_1$ = 2N5086 | $R_9$ = 10K | $R_{AH}$ = 3300 |
| $Z_A$ = 2N3954 | $R_{36}$ = 20K | $R_{44}$ = 20K |
| $Z_B$ = 2N3954 | $R_{38}$ = 20K | $R_{26}$ = 1K |
| $U_1$ = LM308 | $R_{30}$ = 20.1K | $R_{17}$ = 26.1 |
| $U_2$ = LM308 | $R_8$ = 100K | $R_{16}$ = 3160 |

Power Supply

Although any rectifying power supply could be used to provide the operating voltages $+V$ and $-V$ for $U_1$, $U_2$, $Q_1$, $Q_{2A}$ and $Q_{2B}$, the power supply P illustrated in FIG. 3 is especially advantageous because it has less voltage drop than a silicon diode or a Schottky barrier diode. This is achieved by utilizing the emitter-to-collector path of a transistor as the rectifying element rather than a diode.

The emitter of a PNP transistor $Q_3$ is connected to one side $I_1$ of the voltage supply 31, and its collector is connected via a capacitor 52 to a point of reference potential. The emitter of an NPN transistor $Q_4$ is connected to the other side $I_2$ of the voltage supply 31, and its collector is connected via a capacitor 54 to the point of reference potential. A parallel combination of a capacitor 56 and a resistor 58 is connected between the bases of $Q_3$ and $Q_4$. An operating voltage $+V$ is produced across the capacitor 52; and an operating voltage $-V$ is produced across the capacitor 54. In order to assure that these voltage will have equal values, equal resistors 60 and 62 may be connected between the emitters of $Q_3$ and $Q_4$ and reference potential.

The operation of the power supply P is as follows. In AC operation when the input $I_1$ goes positive, the emitter-base junction of $Q_3$ and the emitter-base junction of $Q_4$ conduct so as to charge the capacitor 56 as indicated. Therefore, both $Q_3$ and $Q_4$ have equal base currents flowing in a direction such as to turn them on and charge the capacitors 52 and 54 in the polarity indicated. In subsequent oppositely-poled half-cycles of the voltage from the supply 31, the resistor 58 partially discharges the capacitor 56 to produce the appropriate base currents at peak voltage. With the circuit values indicated below, $Q_3$ and $Q_4$ are able to charge the capacitors 52 and 54 to within 100 mv of the peaks. Silicon diodes would cause a difference of about 0.6 volt. This is important because it enables more voltage to be supplied to operating amplifiers $U_1$ and $U_2$.

When the power supply 31 provides a DC voltage, $Q_3$ and $Q_4$ conduct continuously because base current continuously flows through the resistor 58. Once the capacitors 52 and 54 are charged to 50 mv less than the DC voltage, continuous voltage is available to $Q_1$, $Q_{2B}$, $Q_{2A}$, $U_1$ and $U_2$.

TABLE

| | |
|---|---|
| $Q_3$ = 2N404 | $C_{56}$ = 1.0 μf |
| $Q_4$ = 2N5271 | $R_{58}$ = 250 K |
| $C_{52}$ = 22 μf | $R_{60}$ = 350 |
| $C_{54}$ = 22 μf | $R_{62}$ = 350 |

Analysis of FIG. 3

Design Objectives

The principal design objectives for the circuit are as follows:

(a) liner variation of the output voltage of the bridge with the value of $1/C_X$ or a nonlinear variation of the output voltage of the bridge with the value of $1/C_X$ in order to compensate for a nonlinear relation between the values of $1/C_X$ and the pressure or other phenomena P;

(b) obtain a desired output impedance $Z_0$ for the bridge B (400 ohms in the embodiment of FIG. 3);

(c) as much sensitivity as possible while meeting other objectives (about 7 μv/mm Hg/volt across the bridge);

(d) permit the use of practicable FETs for $Z_A$ and $Z_B$;

(e) as little load on $U_2$ as possible.

Linear Bridge Output

Figure 3F:
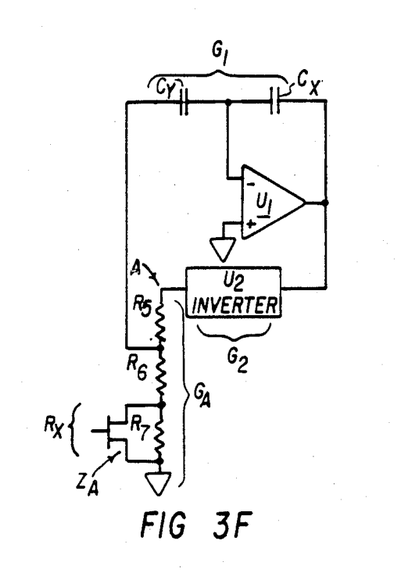
FIG. 3F illustrates the oscillatory loop of FIG. 3.
Figure 3G:
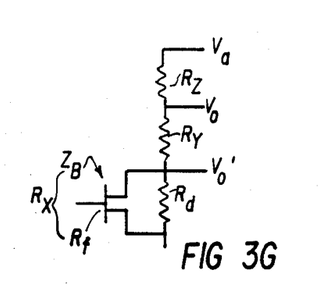
FIG. 3G is a Thevenin equivalent of the bridge B of FIG. 3.

In order to show that the voltage between the output terminals $OT_1$ and $OT_2$ of the bridge B of FIG. 3 is linearly related to $1/C_X$ and therefore to the pressure or other phenomena P, reference is made to FIG. 3F which is an equivalent circuit of the oscillator loop of FIG. 3, and to FIG. 3G which is (for reasons to be explained) a Thevenin equivalent of the bridge circuit B. The resistance of the FET $Z_A$ of FIG. 3F and the resistance of the FET $Z_B$ of FIG. 3G are both equal to $R_f$ because the FETs $Z_A$ and $Z_B$ are a matched pair or a dual FET. The resistors $R_7$ and $R_d$ that are respectively in shunt with $Z_A$ and $Z_B$ are made equal so that the parallel combination of each FET and its shunt resistance has the same value $R_X$, which varies with the value of the AGC control voltage. Expressions for $R_X$ are derived from FIGS. 3F and 3G and equated to each other to show that the change in voltage across $Z_B$ is linearly related to the change in $1/C_X$. It will then be shown that the voltage at the output terminals $OT_1$ and $OT_2$ is linearly related to the voltage across $Z_B$ and therefore linearly related to changes in $1/C_X$ and therefore the change in pressure or other phenomena P.

Reference is now made to FIG. 3F which, as is evident, is a simplified circuit for the oscillatory loop of FIG. 3 that is formed by $U_1$, $U_2$ and the attenuator A. As in the analysis of FIG. 2, the product of the gains $G_1$, $G_2$ and $G_A$ for $U_1$, $U_2$ and the attenuator A respectively is equated to unity, a condition that must exist for oscillations to be sustained at a constant amplitude. These gains are respectively represented by $$G_1 = -(C_X/C_Y) \tag{22}$$

$$G_2 = (-1) \tag{23}$$

and $$G_A = \frac{R_6 + R_X}{R_5 + R_6 + R_X} \tag{24}$$

When these are multiplied together and equated to unity, $R_X$ will be found to be $$R_X = \frac{R_5}{(C_X/C_Y) - 1} - R_6. \tag{25}$$

Reference is now made to FIG. 3G in which the voltage $V_a$ is the voltage between the points where $Z_B$ is connected to the bridge B of FIG. 3 when $Z_B$, $R_{14}$ and $R_{15}$ are removed from the circuit and the sum of $R_Y$ and $R_Z$ equals the total resistance $R_T$ between these points as required by Thevenin's theory. Under this condition, a given change in the resistance of $Z_B$ when it and $R_{14}$ and $R_{15}$ are in the circuit will produce the same voltage between the points of connection of $Z_B$ in the bridge B as will exist across $Z_B$ in FIG. 3G. The reason for using $V_a$ in FIG. 3G instead of the voltage $V_i$ from the source 31 is simply that the voltage dividing action of the resistors $R_{13}$ and $R_{17}$ and of $R_{16}$ and $R_{17}$ makes the voltage $V_a$ across $Z_B$ of FIG. 3G when it is removed from the circuit less than $V_i$.

By inspection of FIG. 3G, $$\frac{V_O}{V_a} = \frac{R_Y + R_X}{R_Y + R_X + R_Z}. \tag{26}$$

Solving (26) for $R_X$ yields $$R_X = \left(\frac{R_Z}{(V_a/V_O) - 1}\right) - R_Y. \tag{27}$$

From a comparison of (25) and (27), it can be seen that if $R_6 = R_Y$ and $R_5 = R_Z$ $$V_O/V_a = C_Y/C_X \tag{28}$$

and therefore that $$V_O/V_a = 1/C_X \approx \Delta P \tag{29}$$

so that $V_O/V_a$ is linearly related to $1/C_X$ and the changes in the phenomena of interest.

By equating the expressions (25) and (27) and solving for $V_O/V_a$, we obtain an expression including $C_X$ and $C_Y$ if $R_6 = R_Y$.

$$\frac{V_O}{V_a} = \frac{1}{\left[\frac{R_Z}{R_5}\left(\frac{C_X}{C_Y} - 1\right) + 1\right]} \tag{30}$$

If $R_Z = R_5$, $(V_O/V_a) = (C_Y/C_X)$ as in (28).

$V_O'$, the driving voltage for the output of the bridge in FIG. 3G, will also be linear with respect to $1/C_X$ and P because it is produced by the same current through $R_Y$ and $R_Z$. The value of $V_O'$ in terms of $V_O$ is given by $$\frac{V_O'}{V_O} = \frac{R_Y + R_Z}{R_Z} \tag{31}$$

Figure 3H:
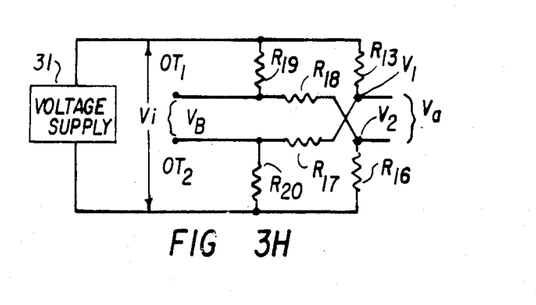
FIG. 3H is a schematic of the bridge B used in calculating $V_a/V_i$.
Figure 3I:
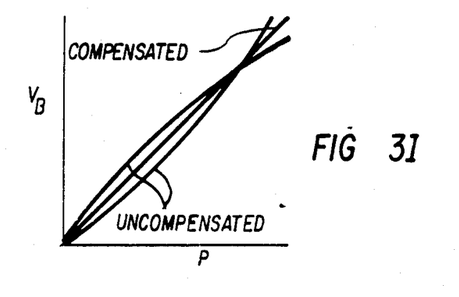
FIG. 3I illustrates how transducer nonlinearity may be compensated.

The value of $V_O$ with respect to $V_a$ was given by (26), and the relationship between $V_a$ and $V_i$, the voltage of the source 31, is now determined by reference to FIG. 3H which shows the bridge circuit with $R_X$ (i.e., $R_{14}$ and $R_{15}$ in shunt with $Z_B$) removed so that the open circuit voltage $V_a$ used in the Thevenin equivalent circuit of FIG. 3G is $$V_a = V_1 - V_2. \tag{32}$$

The voltage $V_1$ in terms of the voltage $V_i$ provided by the source 31 is seen by inspection to be $$V_1 = V_i\left(\frac{R_{17} + R_{20}}{R_{20} + R_{17} + R_{13}}\right); \tag{33}$$

the voltage $V_2$ in terms of the voltage $V_i$ is $$V_2 = V_i \left( \frac{R_{16}}{R_{19} + R_{18} + R_{16}} \right) \tag{34}$$

and $$\frac{V_a}{V_i} = \left( \frac{R_{20} + R_{17}}{R_{20} + R_{17} + R_{13}} \right) - \left( \frac{R_{16}}{R_{19} + R_{18} + R_{16}} \right). \tag{35}$$

From (30), (31) and (35), the ratio of $V_O'$ to $V_i$ can be determined. There is nothing here to upset the linear relationship of $V_O'$ and $1/C_X$ and $\Delta P$.

But $V_O'$ is not the voltage $V_B$ at the output terminals of the bridge B. By inspection of the actual bridge B, $V_B$ in terms of $V_O'$, the voltage across $Z_B$ in the bridge, is given by $$\frac{\Delta V_B}{V_O'} = \frac{1}{2} \left( \frac{R_{19}}{R_{18} + R_{19}} \right) + \frac{1}{2} \left( \frac{R_{20}}{R_{17} + R_{20}} \right). \tag{36}$$

$\Delta V_B$ will vary linearly with $1/C_X$ as is desired because $(V_i/V_a) = (C_Y/C_X)$ (28).

Sensitivity

The sensitivity of the circuit is $\Delta V_B/V_i$ and is given by $$\frac{\Delta V_B}{V_i} = \frac{V_O}{V_a} \ (30) \times \frac{V_O'}{V_O} \ (31) \times \tag{37}$$

$$\frac{\Delta V_B}{V_O'} \ (36) \times \frac{V_a}{V_i} \ (35).$$

In calculations that follow, a shorthand notation will be used where the symbol $\|$ means parallel and a plus sign (+) means a series connection. The actual algebraic expressions can be derived by working from right to left through an expression having a number of $\|$ and + symbols. By way of example, if $R_A$ and $R_B$ are in parallel and this parallel combination is in series with $R_C$, the shorthand notation would be written as $R_C + R_A \| R_B$ and the algebraic expression would be $$R_C + \frac{1}{(1/R_A + 1/R_B)} \tag{38}$$

Output Impedance of the Bridge

Referring to bridge B of FIG. 3, the output impedance $Z_O$ of the bridge B is determined as follows. $R_X$ is the resistance of $Z_B$ in parallel with the series resistors $R_{14}$ and $R_{15}$. Also consider that there is a phantom ground in the voltage supply 30 so that $R_{13}$ and $R_X/2$ are in parallel. This parallel combination is in series with $R_{17}$ and the entire series parallel combination in parallel with $R_{20}$. For symmetry, $R_{14} = R_{15}$; $R_{19} = R_{20}$; $R_{17} = R_{18}$; and $R_{13} = R_{16}$ so that half the impedance of the bridge is symbolized by $$Z_O/2 = R_{20} \| [(R_{17} + R_{13} \| (1/2)R_X] \tag{39}$$

and the algebraic expression is $$\frac{Z_O}{2} = \frac{1}{(1/R_{20}) + \left( \frac{1}{R_{17} + \frac{1}{(1/R_{13}) + (2/R_X)}} \right)} \tag{40}$$

Voltage Across $Z_B$

Inasmuch as the voltage $V_f$ across the FET $Z_B$ must be kept low in order that the FET act like a resistor, it is useful to have an expression for it. Assuming that the resistors 48 and 50 are set to zero, a condition for maximum sensitivity, the voltage $V_f$ appearing across the FET $Z_B$ at a null condition is, using the shorthand approach:

$$V_f = V_i/2[((1/2)R_X \| R_{17})/(R_{13} + ((1/2)R_X \| R_{17}))]\cdot \times 2 \tag{41}$$

As is obvious, the 2's cancel, but they are shown uncancelled to emphasize the point that the voltage divider in the brackets divides one-half of $V_i$ but is only one-half of the voltage across $Z_B$ so that the result must be multiplied by two. From (41), the algebraic expression for $V_f$ is seen to be $$V_f = V_i \left[ \frac{\frac{1}{(2/R_X) + (1/R_{17})}}{R_{13} + \left( \frac{1}{2/R_X + 1/R_{17}} \right)} \right] \tag{42}$$

Relationship of $R_{20}$, $R_{17}$ and $R_{19}$, $R_{18}$

At balance, $OT_1$ and $OT_2$ are at ground potential, and because the same current $i$ flows through $R_{17}$ and $R_{20}$ or $R_{19}$ and $R_{18}$, it can be seen that $$(1/2V_j)/R_{20} = i = (1/2V_j)/R_{17} \tag{43}$$

from which we obtain $$R_{20} = R_{17}(V_i/V_j) \tag{44}$$

and similarly $$R_{19} = R_{18}(V_i/V_j) \tag{45}$$

Values of Resistors 5 and 6 of FIG. 3

In the circuit of FIG. 3G, the impedance $R_T$ seen by looking into the points where $R_X$ is coupled (but with $R_X$ removed) is $$R_T = R_Y + R_Z \tag{46}$$

In order that FIG. 3G be a Thevenin equivalent of the actual bridge circuit of FIG. 3, the actual impedance $R_T$ seen looking into the points where $R_X$ is coupled to the bridge but with $R_X$ removed should be the same in both the actual circuit and the Thevenin equivalent. The shorthand expression for this impedance $R_T$ is $$R_T = (R_{13} \| (R_{17} + R_{20})) + (R_{16} \| (R_{18} + R_{19})) \tag{47}$$

for which the algebraic expression is $$R_T = \left( \frac{1}{(1/R_{13}) + (1/(R_{17} + R_{20}))} \right) + \tag{48}$$

$$\left( \frac{1}{(1/R_{16}) + (1/(R_{18} + R_{19}))} \right)$$

In the comparison of (25) and (27) that was done in the process of showing that the output $V_B$ of the bridge was linear to $1/C_X$, it was pointed out that linearity required $R_6 = R_Y$ and $R_5 = R_Z$ so that $$R_Y + R_Z = R_T = R_5 + R_6 \tag{49}$$

and $$R_5 = R_T - R_6. \tag{50}$$

Substituting this for $R_5$ in (25) gives $$R_X = \left( \frac{R_T - R_6}{(C_X/C_Y) - 1} \right) - R_6. \tag{51}$$

Solving (51) for $R_6$ gives $$R_6 = R_T(C_Y/C_X) - R_X \left( 1 - \frac{C_Y}{C_X} \right). \tag{52}$$

Determination of Resistor Values

From the preceding analysis of FIG. 3, it is readily apparent that many different combinations of resistor values might be used to attain each of the design objectives referred to, and that the values of resistors that reach one objective may not necessarily optimize another. Therefore, the resistance values necessary to attain one design objective such as a suitable output impedance $Z_O$ for the bridge B may not permit the attainment of a satisfactory sensitivity or a high enough impedance for the load on the output of $U_2$. Consequently, an iterative process is used for determining resistance values that reasonably attain all design objectives. Those objectives of greater importance can be attained more precisely than the others, so that a practicable compromise is reached. Whereas the procedure may consider the design objectives in any sequence, one sequence is generally set forth below.

Before generally describing a procedure, however, the facts that are known or easily determinable are now set forth. The minimum value of $V_i$ to be encountered in the equipments with which the circuit of this invention is to be used is known, resulting in known supply voltage. Thus, FETs which exhibit a variable resistance characteristic at a given control voltage range can be selected. For the particular FETs selected, the range of $R_f$ is known. From the sensor design, $C_X$ and $C_Y$ are known, and the input impedance of the equipment with which the circuit is to be used is also known so that the desired $Z_O$ is known. From a comparison of equations (25) and (27), it is known that for linearity of $\Delta V_B$ with $1/C_X$ or $\Delta P$, $R_6 = R_Y$, $R_5 = R_Z$, and $R_{14} + R_{15} = R_7$. For symmetrical operations $R_{13} = R_{16}$, $R_{14} = R_{15}$, $R_{17} = R_{18}$, and $R_{19} = R_{20}$. In order to make the relationship of the bridge output voltage $V_B$ and the pressure or other phenomena $\Delta P$ the same for transducers in which the variation of $C_X$ with P is different, resistors 48 and 50 are included so as to adjust the effective value of $V_i$ across the bridge. In a circuit of FIG. 3 having the component values previously suggested and a particular sensor design, the sensitivity is 7 $\mu$v/mm Hg/$V_i$ so that the sensitivity can be reduced as needed by the resistors 48 and 50 to the desired value of 5 $\mu$v/mm Hg/$V_i$ for more sensitive transducers.

To begin with, it can be seen from (48), (53) and (49) that $R_{13}$ and $R_{16}$ must be reasonably high if $R_5$ and $R_6$ are to be high enough to avoid loading $U_2$ too much. Then, because FETs $Z_A$ and $Z_B$ require a low voltage across them in order to exhibit the desired variable resistance characteristic, $R_{14}$ and $R_{15}$ will generally have to be much less than $R_{13}$ and $R_{16}$. Because $R_{14}$ and $R_{15}$ are in parallel with $Z_B$, the value of $R_X$ can be determined if an initial value of $R_f$ is chosen.

$$R_X = \frac{1}{(1/(R_{14} + R_{15})) + (1/R_f)} \tag{53}$$

$R_X$ for $Z_A$ is the same because $R_{14} + R_{15} = R_7$. If, for example, the output impedance $Z_O$ is to be 400 ohms, the sum of $R_{14}$ and $R_{15}$ should have nearly that value.

Compensating Nonlinearity

It has been demonstrated that the output voltage $V_B$ of the bridge B is linearly related to changes in $1/C_X$ if the actual impedance $R_T$ of the bridge B (48) is equal to $R_5 + R_6$; but in order to compensate for any nonlinearity between $1/C_X$ and P, the relationship of $1/C_X$ and $V_B$ can be made to vary nonlinearly. By making the sum of $R_5$ and $R_6$ greater or less than $R_T$, the degree of nonlinearity can be determined from $$\frac{V_O}{V_i} = \frac{1}{R_Z \left( \frac{1}{[R_5/(C_X/C_Y) - 1] - R_6 + R_y} \right) + 1} \tag{54}$$

AGC Signal Linear with $1/C_X$ or P

Figure 3J:
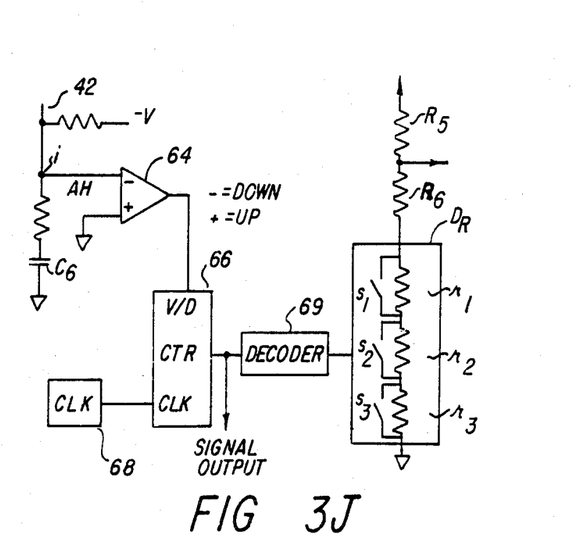
FIG. 3J illustrates the use of a digitally controlled resistor in the attenuator A.

Reference is now made to FIG. 3J in which a digitally controlled resistance means $D_R$ is substituted for the parallel combination of $Z_A$ and $R_7$ in FIG. 3 and components 34, 36 and 38 are removed. The AGC control signal that appears across the series combination of AH and $C_6$ is applied to one input of a comparator 64. The other input of the comparator 64 is connected to a reference voltage, and the output of the comparator 64 is connected to the up/down control terminal of a counter 66. A clock 68 supplies uniformly spaced pulses, which could be at the oscillatory frequency, to the clock input terminal of the counter 66. The output of the counter 66 is digital and is applied through a decoder 69 so as to set the resistance of $D_R$ at a desired value. The internal circuit of the digitally controlled resistance $D_R$ is schematically represented by series resistors $r_1$, $r_2$ and $r_3$ that are respectively shunted by switches $s_1$, $s_2$ and $s_3$; but in actuality, the resistor connections would be much more complicated.

The operation of the circuit of FIG. 3 with the attenuator circuit of FIG. 3J incorporated therein as described is as follows. At equilibrium, the voltage across $C_6$ is nearly equal to $V_{REF}$ so that the output of the comparator 64 is switching because the amplitude of the oscillations is hunting. Assume that the pressure or other phenomena P changes in value. The consequent change in $C_X$ changes the gain of the loop so as to cause a corresponding change in the amplitude of the oscillations occurring therein. During each cycle of these oscillations, the voltage across $C_6$ is changed, thereby causing the output of the comparator 64 to become high or low for several cycles, depending on whether the gain is greater or less than unity, and causing the counter 66 to count up or down at the rate determined by the clock 68. At each count, the coded output of the counter 66 changes, and each output causes different combinations of the switches $s_1$, $s_2$ and $s_3$ in $D_R$ to open or close, thereby placing the corresponding resistor combination in the attenuator circuit. Eventually, the resistance of $D_R$ reaches a value such as to restore the loop gain nearly to unity and the previously described hunting resumes. The value of the output of the counter 66 necessary to bring this about will depend on the nonlinearity of $D_R$. If this nonlinearity is such as to compensate for other nonlinearities in the system, see equation (54), and any nonlinearity between P and $C_X$, the digital output of the counter 66 varies linearly with the pressure or other phenomenon of interest and would be the output signal.

What is claimed is:

1. A transducer circuit for producing an output signal in response to variations in the value of a reactive sensing impedance, comprising amplifying means having an output and an input, a loop coupling said output to said input so as to cause oscillations to occur therein, said loop having circuit components for determining the frequency at which the oscillations occur, a reactive sensing impedance coupled to said loop so that changes in the value of the reactive sensing impedance effect a change in the gain of the loop, means responsive to an applied signal for controlling the gain of said loop, an automatic gain control circuit applied to said loop for providing a control signal at its output, said control signal having a value corresponding to the amplitude of oscillations occurring in said loop, means for applying the control signal from said automatic gain control circuit to said means for controlling the gain of said loop so as to return the gain of the loop to unity after the gain is made to depart from unity by a change in the value of said reactive sensing impedance, and an output coupled to the output of said automatic gain control circuit.

2. A transducer circuit as set forth in claim 1 further comprising rectifying means having an input to which a drive voltage may be applied and an output, said output being coupled to provide operating potential for said amplifying means, a bridge circuit coupled to said output, means for applying a drive voltage, when present, across one diagonal of said bridge, said bridge circuit having a variable resistive means connected between given points thereof for controllably unbalancing the bridge in response to a signal applied to said variable resistive means whereby the resistance of said variable resistive means is controlled by the control signal and an output signal is provided by said bridge across its other diagonal.

3. A transducer circuit as set forth in claim 2 wherein said means for controlling the gain of said loop is a resistive voltage divider having a variable resistive means connected between predetermined points thereof, and wherein a first ratio of the resistance of said bridge as viewed from said given points where said variable resistive means is connected, with said variable resistive means removed, to the resistance presented by said voltage divider at said predetermined points where said variable resistive element is connected, with said variable resistive element removed, is the same as a second ratio of the resistance of said variable resistance means in said bridge circuit to the resistance of said resistive element in said voltage divider for different values of said control signal.

4. A transducer circuit as set forth in claim 3 wherein said first ratio is different from said second ratio so as to make the output signal provided by the bridge nonlinear.

5. A transducer circuit as set forth in claim 3 wherein the ratio of the voltage between said points in the bridge circuit when said variable resistive means is removed therefrom and the voltage between said points when said variable resistive means is connected between said points is inversely proportional to the gain introduced into the loop by said gain control means.

6. A transducer circuit as set forth in claim 1 wherein said gain control means for said loop responds to the gain control signal in such manner that the gain control signal varies linearly with changes in the value of said reactive sensing impedance so that said gain control signal is the output signal.

7. A transducer circuit as set forth in claim 1 in which a comparator having one input connected to a point of reference potential, the other input coupled to said automatic gain control circuit and its output connected to the up/down terminal of a counter, a clock connected to a clock terminal of said counter, a decoder coupled between the output of said up/down counter and the control input of said digitally controlled resistive element, the decoder being such that the variation in resistance it causes said digitally controlled resistor to have is such that the digital output of said up/down counter represents a value that varies linearly with changes in the value of said reactive sensing impedance.

8. A transducer circuit, comprising a first operational amplifier having positive and negative inputs and an output, said positive input being connected to a point of reference potential, a first capacitor connected between the output of said amplifier and its negative terminal, and one side of a second capacitor connected to said negative terminal, one of said capacitors being a sensing impedance such that its value can be changed by a phenomenon of interest, a second operational amplifier having positive and negative inputs and an output, a third capacitor and a resistor connected in series between the output of said first amplifier and the negative input of said second amplifier, the positive input of said second amplifier being connected to a point of reference potential, and a parallel combination of a fourth capacitor and a resistor connected between the output of said second amplifier and its negative input, an attenuator comprised of first and second resistors and a variable resistive element connected in series in the order named between the output of said second amplifier and a point of reference potential, the junction of said first and second resistors being connected to the other side of said second capacitor so as to form an oscillatory loop that oscillates at a frequency determined by said third and fourth capacitors and the resistors with which they are connected, an automatic gain control circuit coupled to said oscillating loop so as to produce a control signal having an amplitude that varies in accordance with the amplitude of oscillations occurring in said loop, means coupled to said automatic gain control circuit for causing the resistance of said variable resistive element to vary in accordance with the amplitude of the control signal, a resistive bridge circuit having a variable resistive means that can unbalance the bridge, means for applying a drive voltage, when present, across said bridge, rectifying means for deriving operating potentials for said amplifiers from said drive voltage, when present, and means for changing the resistance of said resistive means with the control signal so as to cause the bridge to produce an output signal having an amplitude variation that is related to changes in the value of the capacitor that serves as a sensing impedance.

9. A transducer circuit as set forth in claim 8 wherein said variable resistive element in said attenuator and said variable resistive means in said bridge circuit are matched.

10. A transducer circuit as set forth in claim 9 wherein said resistive bridge is comprised of
third, fourth, fifth and sixth resistors connected in series between first and second terminals connected to opposite sides of said drive voltage, when present, the junction of said fourth and fifth resistors being connected to a point of reference potential and said variable resistive means being connected between the junction of said third and fourth resistors and the junction of said fifth and sixth resistors, seventh and eighth resistors connected in series between said terminal that is connected to said third resistor and the junction of said fourth and fifth resistors, ninth and tenth resistors connected between said terminal that is connected to said sixth resistor and the junction of said third and fourth resistors, whereby an output signal appears between the junction of said seventh and eighth resistors and the junction of said ninth and tenth resistors.

11. A circuit for coupling a reactive sensing impedance to a bridge circuit in such manner that the relationship between the output signal of the bridge has a desired degree of non-linearity with respect to changes in the value of the reactive sensing impedance caused by a phenomenon of interest, comprising
a loop including amplifying means contributing a gain of $G_1$ to the loop, means for coupling said reactive sensing impedance to said loop in such manner as to contribute a gain of $G_2$ to the loop, there being a given value of $G_2$ when the sensing impedance is free from the effect of the phenomenon of interest, and gain control means having a variable element connected to predetermined points thereof, said gain control means contributing a gain of $G_3$ to the loop, there being a given value of $G_3$ when said reactive sensing impedance is free from the effect of the phenomenon of interest, the product of $G_1$, the given value of $G_2$ and the given value of $G_3$ being unity so that said loop oscillates at a frequency determined by circuit components included in said loop, an automatic gain control circuit coupled to said loop for producing a gain control signal related to the amplitude of the oscillations in the loop, means coupling said gain control signal to said variable element of said gain control means so as to cause it to change $G_3$ in such direction as to compensate for any changes that may be brought about in $G_2$ by changes in the value of the sensing impedance and thereby keep the gain of the loop at unity, a resistive bridge circuit having variable resistance means connected between points therein in such manner that changes in the value of the said variable resistance unbalance the bridge, means coupling said gain control signal to said variable resistance so as to vary its value, and the ratio of the voltage between said points in the bridge circuit when said variable resistive means is removed from the circuit and the voltage between said points for a value of the gain control signal when the variable resistance means is connected in the bridge circuit is $1/G_3$, the latter value of $G_3$ occurring in response to the latter gain control signal.

12. A circuit for coupling a reactive sensing impedance to a bridge circuit in such manner that the relationship between the output signal of the bridge has a desired degree of nonlinearity with respect to changes in the value of the reactive sensing impedance caused by a phenomenon of interest, comprising
a loop including amplifying means contributing a gain of $G_1$ to the loop, means for coupling said reactive sensing impedance to said loop in such manner as to contribute a gain of $G_2$ to the loop, there being a given value of $G_2$ when the sensing impedance is free from the effect of the phenomenon of interest, and gain control means having a variable element connected to predetermined points thereof, said gain control means contributing a gain of $G_3$ to the loop, there being a given value of $G_3$ when said reactive sensing impedance is free from the effect of the phenomenon of interest, the product of $G_1$, the given value of $G_2$ and the given value of $G_3$ being unity so that said loop oscillates at a frequency determined by the circuit components included in said loop, an automatic gain control circuit coupled to said loop for producing a gain control signal related to the amplitude of the oscillations in the loop, means coupling said gain control signal to said variable element of said gain control means so as to cause it to change $G_3$ in such direction as to compensate for any changes that may be brought about in $G_2$ by changes in the value of the sensing impedance and thereby keep the gain of the loop at unity, a resistive bridge circuit having variable resistance means connected between given points therein in such manner that changes in the value of the said variable resistance can imbalance the bridge, means coupling said gain control signal to said variable resistance so as to vary its value, the ratio of the input impedance of said bridge viewed from said given points where the variable resistance means is connected, with the variable resistance means removed from the circuit, to the impedance of said gain control means viewed from the predetermined points where its variable element is connected, with the variable element removed from the circuit, is the same as the ratio of the impedance of said variable resistance to the impedance of the variable element in said gain control means for different values of the control signal.

13. A circuit as set forth in claim 12 wherein said variable element of said gain control means and said variable resistance means of said bridge circuit are matched.

14. A circuit as set forth in claim 12 wherein said variable element of said gain control means and said variable resistance means of said bridge circuit are matched FETs.

15. A circuit as set forth in claim 12 wherein said gain control means is a voltage divider comprised of a series combination of first and second resistors and a variable resistance element, said gain control means being inserted into said loop such that the oscillatory voltage at one point in the loop is applied across said series combination and the output of said gain control means is taken across said variable resistance element and the one of said resistors to which it is connected, and wherein the two ratios are different.

* * * * *